(12) United States Patent
Wong et al.

(10) Patent No.: US 7,677,431 B2
(45) Date of Patent: Mar. 16, 2010

(54) ELECTRONIC DEVICE HANDLER FOR A BONDING APPARATUS

(75) Inventors: Yam Mo Wong, Singapore (SG); Keng Yew James Song, Singapore (SG); Ka Shing Kenny Kwan, Singapore (SG)

(73) Assignee: ASM Technology Singapore Pte Ltd., Singapore (SG)

( * ) Notice: Subject to any disclaimer, the term of this patent is extended or adjusted under 35 U.S.C. 154(b) by 334 days.

(21) Appl. No.: 11/843,012

(22) Filed: Aug. 22, 2007

(65) Prior Publication Data

US 2008/0093004 A1 Apr. 24, 2008

Related U.S. Application Data

(62) Division of application No. 11/550,855, filed on Oct. 19, 2006, now Pat. No. 7,568,606.

(51) Int. Cl.
*B23K 31/02* (2006.01)

(52) U.S. Cl. ................. 228/179.1; 228/49.5; 228/180.5

(58) Field of Classification Search ........................ None
See application file for complete search history.

(56) References Cited

U.S. PATENT DOCUMENTS

| | | | |
|---|---|---|---|
| 5,086,559 A * | 2/1992 | Akatsuchi | 29/834 |
| 5,340,011 A * | 8/1994 | Sanchez | 228/4.5 |
| 5,482,198 A * | 1/1996 | Kohn | 228/6.2 |
| 5,839,645 A * | 11/1998 | Onitsuka | 228/180.22 |
| 6,045,318 A | 4/2000 | Mochida et al. | 414/609 |
| 6,572,010 B2 * | 6/2003 | Dordi et al. | 228/206 |
| 6,749,100 B2 | 6/2004 | Wong et al. | 228/4.5 |
| 7,179,346 B2 * | 2/2007 | Lam et al. | 156/299 |
| 7,513,032 B2 * | 4/2009 | Shimamura et al. | 29/740 |
| 2001/0005602 A1 * | 6/2001 | Mimata et al. | 438/107 |
| 2001/0015372 A1 * | 8/2001 | Yamamoto et al. | 228/180.22 |
| 2005/0011934 A1 * | 1/2005 | Yamauchi et al. | 228/180.22 |
| 2006/0219755 A1 * | 10/2006 | Kajii | 228/39 |
| 2007/0170569 A1 * | 7/2007 | Kim et al. | 257/685 |

FOREIGN PATENT DOCUMENTS

JP 3-293215 A * 12/1991

\* cited by examiner

*Primary Examiner*—Kiley Stoner
(74) *Attorney, Agent, or Firm*—Ostrolenk Faber LLP

(57) ABSTRACT

A large electronic device having a bonding area on one side that comprises first and second portions may be bonded by first locating the first portion but not the second portion of the electronic device for bonding by a bonding tool. After the first portion of the electronic device has been bonded, the electronic device is conveyed to a rotary platform that is rotatable along a substantially horizontal plane. The electronic device is rotated on the rotary platform to change the respective positions of the bonded first portion and unbonded second portion of the electronic device, before the electronic device is conveyed to the bonding tool such that the second portion of the electronic device is located for bonding by the bonding tool. The second portion of the electronic device may then be bonded.

5 Claims, 5 Drawing Sheets

(a)

(b)

(c)

(d)

(e)

(a)

(b)

(c)

(d)

(e)

ELECTRONIC DEVICE HANDLER FOR A BONDING APPARATUS

CROSS-REFERENCE TO RELATED APPLICATIONS

This application is a divisional of U.S. application Ser. No. 11/550,855, filed Oct. 19, 2006, now U.S. Pat. No. 7,568,606 entitled ELECTRONIC DEVICE HANDLER FOR A BONDING APPARATUS, the contents of which are incorporated by this reference.

BACKGROUND OF THE INVENTION

1. Field of the Invention

The invention relates to a bonding apparatus for electronic devices, and in particular to a handler station for temporary storage and/or manipulation of electronic devices prior to and subsequent to bonding, such as wire bonding or die bonding.

2. Background and Prior Art

In the process of forming a semiconductor integrated circuit package, a series of steps are taken to assemble various components to form a finished package, such as die bonding and wire bonding. Die bonding refers to the attachment of a semiconductor die to a carrier, such as a leadframe. Wire bonding is a process where wires, for instance copper or gold wire, are bonded on electrical contacts on the semiconductor die and corresponding carrier in order to electrically connect the components. Thereafter, the semiconductor die is encapsulated with molding compound to form a semiconductor package and then each package is singulated to separate it.

Traditionally, wire bonders have used single bond heads due to simplicity of implementation. However, U.S. Pat. No. 6,749,100 entitled "Multiple-Head Wire-Bonding System" reveals a wire bonding apparatus with multiple bond heads. Such a wire bonding apparatus enables bonding of multiple electronic devices on a wire bonding machine with a smaller footprint as compared to having separate machines. At the same time, it offers greater productivity. However, such a machine gives rise to more demanding handling needs due to the merging of multiple bond heads onto one platform.

One example is the loading of electronic devices to the bonding apparatus for bonding and unloading of the same after bonding. Conventionally, an input magazine is mounted on a loader side of the bonding apparatus for feeding unbonded electronic devices and an output magazine is mounted on an unloader side of the bonding apparatus for storage of bonded electronic devices after bonding. This is illustrated in U.S. Pat. No. 6,045,318 entitled "Lead Frame Supplying Method and Apparatus". Electronic devices are introduced from one side of the bonding apparatus to a bonding tool, and after bonding, it is moved to the other side of the bonding apparatus to be unloaded. Although this set-up is straightforward and convenient for a bonding apparatus with a single bond head, it is not useful for a bonding machine with multiple bond heads since the electronic devices will either have to pass through another bond head to get to the other side of the bonding machine, thereby disrupting bonding at the other bond head, or take a longer route to bypass the other bond head, which greatly increases complexity and traveling time.

To avoid the aforesaid problems, it would thus be desirable to have separate input and output magazines that are both located on one side of a bonding apparatus. However, the conventional way of orienting the storage slots or feeding passages of the magazines in parallel with a conveying track of the bonding apparatus takes up considerable space when two magazines are placed side-by-side at the end of the conveying track. Moreover, since the conveying track is generally stationary, further space is required to move the two magazines sideways relative to the conveying track to respectively feed unbonded electronic devices or receive bonded electronic devices. Since the magazines are quite large in order to store multiple electronic devices, they might encroach into the space already occupied by other components of the bonding machine due to the sideways motion. It would be advantageous if the two magazines are arranged in another orientation that avoids the magazines being obstructed by other components of the bonding machine.

There are also certain electronic devices introduced for semiconductor integrated circuit packaging which have large bonding areas as compared to conventional ones. These electronic devices have a length in an x-axis that is parallel to the direction in which they are moved along the conveying track, and also a width in a y-axis perpendicular thereto. A difficulty arises if the y-axes of the electronic devices are longer than typical electronic devices. Whilst there is generally no problem in handling their lengths in the x-axis since the conveying track is operable to index the whole x-axis of the electronic device for bonding, to be able to bond the whole electronic device in the y-axis, a positioning table with a longer y-axis table range would be required. To design a positioning table with a longer y-axis table range would increase the moving mass of the positioning table and decreases productivity. It may also increase the footprint of the bonding machine to cater to the increased range of movement. It would be advantageous if the bonding machine could be designed to automatically bond the required surface area of the larger electronic device without the need to increase the y-axis table range of the positioning table.

SUMMARY OF THE INVENTION

It is therefore an object of the invention to seek to provide a system for automatically bonding an electronic device with large bonding area without the need to increase a y-axis table range of a positioning table for locating the electronic device under a bonding tool during bonding.

According to a first aspect of the invention, there is provided a method of bonding a large electronic device having a bonding area on one side that comprises first and second portions, the method comprising the steps of: locating the first portion but not the second portion of the electronic device for bonding by a bonding tool; bonding the first portion of the electronic device; conveying the electronic device to a rotary platform that is rotatable along a substantially horizontal plane; rotating the electronic device on the rotary platform to change the respective positions of the bonded first portion and unbonded second portion of the electronic device; conveying the electronic device to the bonding tool such that the second portion of the electronic device is located for bonding by the bonding tool; and thereafter bonding the second portion of the electronic device. Alternatively, the method may utilize two bonding tools, wherein the first portion is bonded by a first bonding tool and the second portion is bonded by a second bonding tool.

According to a second aspect of the invention, there is provided an apparatus for bonding a large electronic device having a bonding area on one side that comprises first and second portions, the apparatus comprising: a bonding tool that is arranged and configured to bond only the first or the second portion of the electronic device when the electronic device is located at the bonding tool; and a rotary platform that is configured to receive the electronic device after one portion of the electronic device has been bonded by the bonding tool, and which is operative to rotate the electronic device along a substantially horizontal plane to orientate another portion of the electronic device for bonding by the bonding tool thereafter. Alternatively, the apparatus may comprise two bonding tools, wherein the first portion is bonded by a first bonding tool and the second portion is bonded by a second bonding tool.

It will be convenient to hereinafter describe the invention in greater detail by reference to the accompanying drawings, which illustrate one embodiment of the invention. The particularity of the drawings and the related description is not to be understood as superseding the generality of the broad identification of the invention as defined by the claims.

Other features and advantages of the present invention will become apparent from the following description of the invention which refers to the accompanying drawings

BRIEF DESCRIPTION OF THE DRAWINGS

Examples of preferred embodiments of an electronic device handler in accordance with the invention will now be described with reference to the accompanying drawings, in which.

DETAILED DESCRIPTION OF THE PREFERRED EMBODIMENTS OF THE INVENTION

Figure 1:
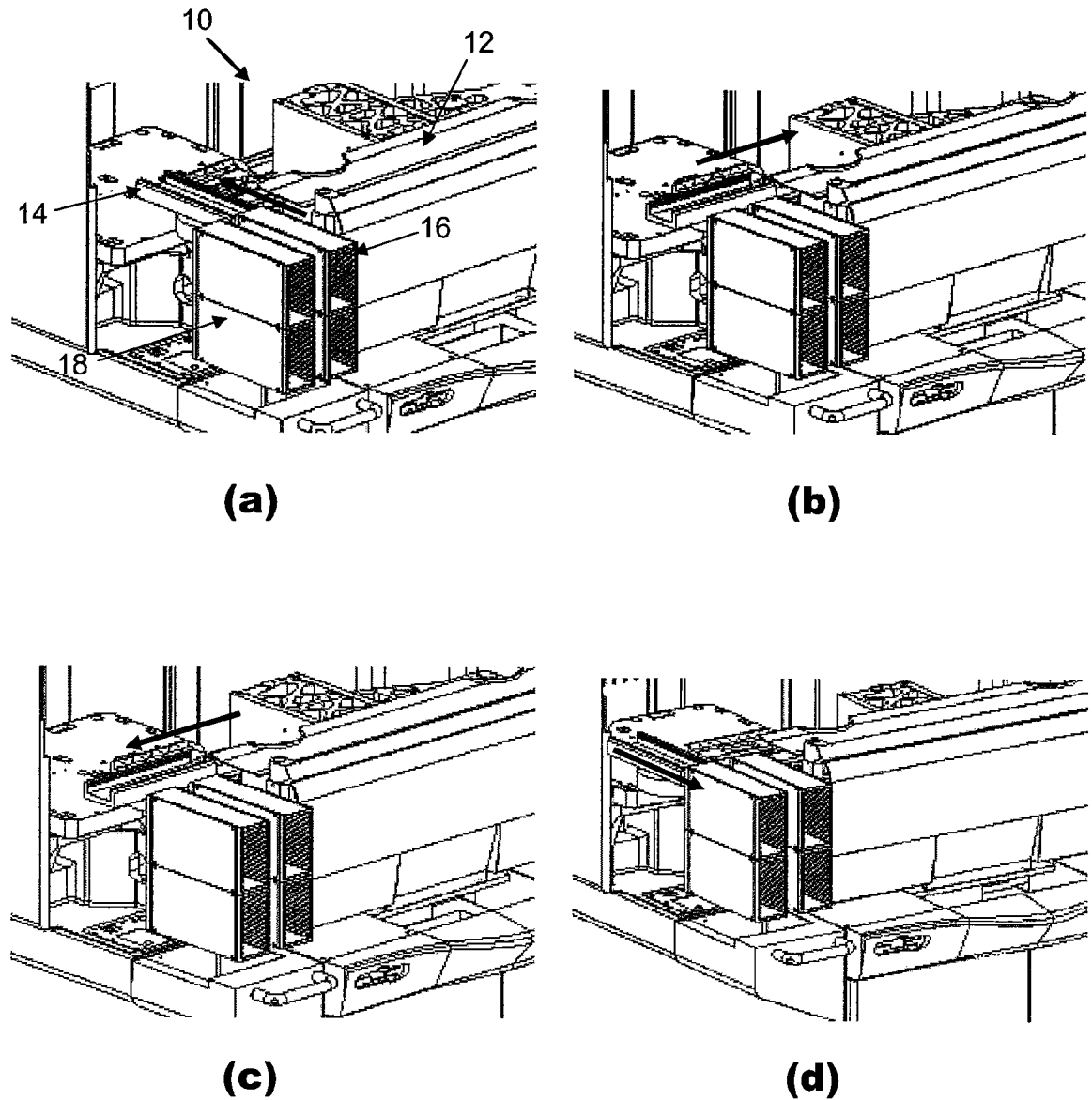
FIGS. 1(a) to 1(d) are isometric views of two magazines mounted on one side of a bonding apparatus and a rotary platform for transferring electronic devices therebetween according to the preferred embodiment of the invention.

FIGS. 1(a) to 1(d) are isometric views of a storage assembly, which may comprise two containers in the form of magazines 16, 18 mounted on one side of a bonding apparatus 10 and a rotary platform such as a rotary buffer 14 for transferring electronic devices, such as leadframes, therebetween according to the preferred embodiment of the invention. The bonding apparatus 10 generally comprises a conveying track 12 for conveying electronic devices towards and away from a bonding tool at which electronic devices are locatable for bonding, an input magazine 16 for storing unbonded electronic devices, an output magazine 18 for storing bonded electronic devices and the rotary buffer 14 for transferring electronic devices between the magazines 16, 18 and the conveying track 12. The bonding tool may be a wire bonding tool.

The magazines 16, 18 are positioned next to each other, and their feeding passages are preferably oriented at an angle to a conveying direction of the conveying track 12, most preferably perpendicular to the conveying direction of the conveying track 12.

The rotary buffer 14 is configured to hold at least one electronic device. It is generally operable at least between an orientation wherein the rotary buffer 14 is aligned with the conveying track 12 for transferring an electronic device between the rotary buffer 14 and the conveying track 12, and another orientation wherein the rotary platform 14 is aligned with the magazines 16, 18 for transferring an electronic device between the rotary buffer 14 and the magazines 16, 18. The rotary buffer 14 may also be configured more generally to be positionable at other orientations. The rotary buffer 14 is preferably configured to rotate along a substantially horizontal plane.

In FIG. 1(a), the rotary buffer 14 is aligned with a feeding passage of the input magazine 16 so as to receive an unbonded electronic device onto the rotary buffer 14. In FIG. 1(b), the rotary buffer 14 is rotated to be aligned with the conveying track 12. In the illustrated embodiment, the feeding passages of the magazines 16, 18 are arranged at an angle of 90° with respect to the conveying track, and the rotary buffer 14 is therefore rotated by 90°. Other orientation angles are possible. During rotation of the rotary buffer 14, if the rotary buffer 14 is situated close to the magazines 16, 18, it may be necessary to raise the rotary buffer 14 to a height above the magazines so that its rotation is not impeded by the magazines 16, 18. After rotation, the rotary buffer 14 may be lowered again. Once the rotary buffer 14 is aligned with the conveying track 12, the electronic device is fed onto the conveying track 12. The electronic device is then sent by the conveying track 12 to the bonding tool of the bonding apparatus 10 for bonding.

In FIG. 1(c), the bonding tool has finished bonding the electronic device, which is then sent back to the rotary buffer 14 by the conveying track 12. In FIG. 1(d), the rotary buffer 14 is rotated in a reverse direction by 90° and is aligned with the feeding passage of the output magazine 18. In order to align the rotary buffer 14 and the output magazine 18, it would be necessary for relative motion of the rotary buffer 14 with respect to the magazines 16, 18 in a direction parallel to the widths of the magazines, as the rotary buffer 14 was previously adjacent to the feeding passage of the input magazine 16. Either the magazines 16, 18 or the rotary buffer 14 may be moved accordingly. Once the rotary buffer 14 and the output magazine 18 are aligned, the bonded electronic device is received by the output magazine 18 for storage. Thereafter, the rotary buffer 14 is aligned with the input magazine 16 for receiving another electronic device for bonding, and the cycle is repeated. Otherwise, if the rotary buffer 14 is suitably constructed with multiple holding slots such that it is configured to receive a bonded electronic device while it is holding an unbonded electronic device, then an unbonded electronic device may be transferred onto the rotary buffer 14 while another electronic device is being bonded to improve efficiency.

FIGS. 2(a) to 2(e) are schematic illustrations of a process for bonding an electronic device 22 with a large bonding area in accordance with a first preferred embodiment of the invention. The bonding apparatus 10 comprises separate input and output magazines 16, 18 on one side of a conveying track 12 as previously described. An electronic device 22 is transferred from the input magazine 16 onto the rotary buffer 14 in FIG. 2(a), and the rotary buffer 14 is then rotated and aligned with the conveying track 12. The electronic device 22 is then carried by the conveying track to a position of a bonding tool 20 for bonding. To avoid the disadvantage of increasing a moving mass of a positioning table as described above, the bonding tool 20 is configured to access only a portion of a whole surface area on one side of the electronic device 22.

Figure 2:
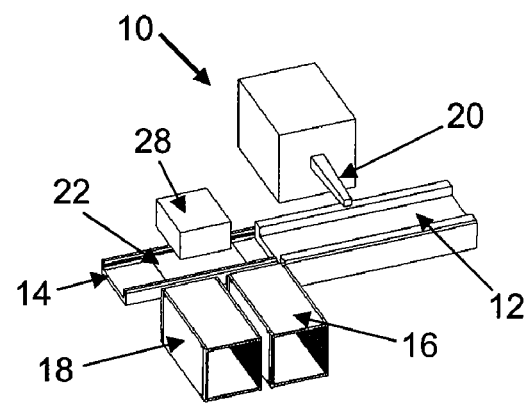
FIGS. 2(a) to 2(e) are schematic illustrations of a process for bonding an electronic device with a large bonding area in accordance with a first preferred embodiment of the invention.
Figure 2:
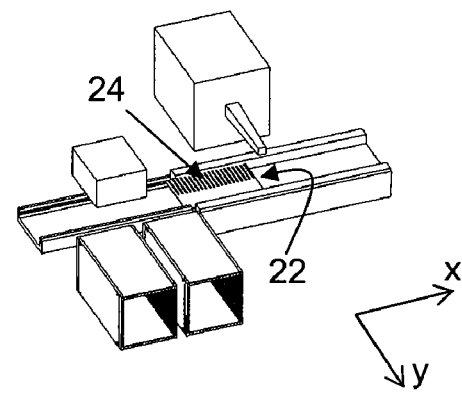
Figure 2:
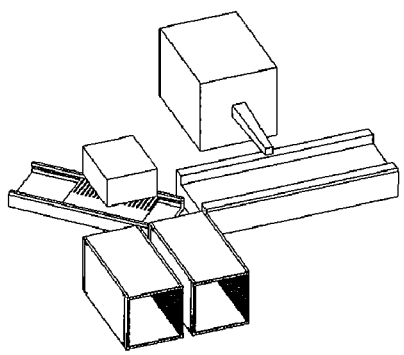
Figure 2:
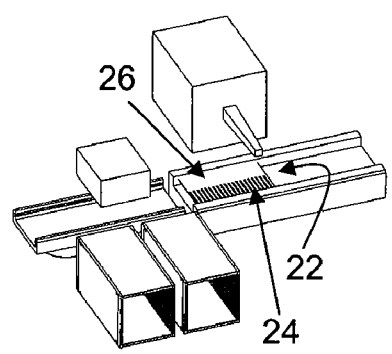
Figure 2:
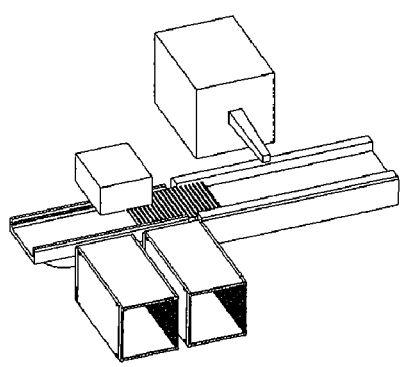

In FIG. 2(b), a first portion 24 of the electronic device 22 has been bonded. This may correspond to half a surface area of the electronic device 22 in the y-axis. The partially-bonded electronic device 22 is then carried away from the bonding tool 20 in the direction of the rotary buffer 14.

In FIG. 2(c), the rotary buffer 14 has received the electronic device 22 and rotates the electronic device 22 by 180° along a horizontal plane. Thus, an unbonded portion 26 of the electronic device 22 is now positioned to be accessible by the bonding tool 20. Thereafter, the electronic device 22 is sent back onto the conveying track 12 so that the unbonded second portion 26 of the device is positioned underneath the bonding tool 20, as illustrated in FIG. 2(d). The second portion 26 of the electronic device 22 is then bonded.

In FIG. 2(e), the second portion 26 has also been bonded so that wire bonding of the whole electronic device 22 has been completed. The bonded electronic device 22 is then sent onto the rotary buffer 14 and transferred to the output magazine 18 as described above. It would be appreciated that, using the aforesaid process for bonding an electronic device 22 with a large bonding area, the need for a positioning table with a large y-axis moving range can be avoided. In fact, complete bonding of the whole electronic device 22 is achievable as long as the positioning table has a y-axis moving range of at least half the Y-axis width of the electronic device 22.

In addition, a processing station 28 may also be located at the position of the rotary buffer 14 to process electronic devices 22 that are transferred onto the rotary buffer 14. The processing station may usefully incorporate one or more functions without the need to increase the length of the conveying track 12 or increase the lateral space or footprint of the bonding apparatus 10. For example, the processing station 28 may comprise an image scanner to perform pre-bond and post-bond inspection without affecting the bonding speed. A visual lead location device may also be added to perform a lead location operation just before bonding the electronic device 22. The processing station 28 may also comprise a cleaning device such as a plasma cleaning kit to remove organic contamination or foreign material before transferring the electronic device 22 onto the conveying track 12 for bonding. As another example, the processing station 28 may comprise a pre-curing device that is operative to heat the electronic device prior to bonding.

FIGS. 3(a) to 3(e) are schematic illustrations of a process for bonding an electronic device 22 with a large bonding area in accordance with a second preferred embodiment of the invention. The difference between this embodiment and the second embodiment of the process is that the input magazine 16 and the output magazine 18 are positioned on opposite sides of the conveying track 12. Therefore, at least one of the magazines may be aligned with the conveying direction of the conveying track 12 and the other magazine may be oriented with its feeding passage at an angle to the conveying direction of the conveying track 12, preferably perpendicular thereto.

Figure 3:
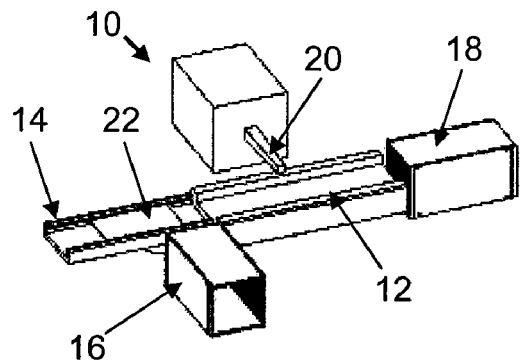
FIGS. 3(a) to 3(e) are schematic illustrations of a process for bonding an electronic device with a large bonding area in accordance with a second preferred embodiment of the invention.
Figure 3:
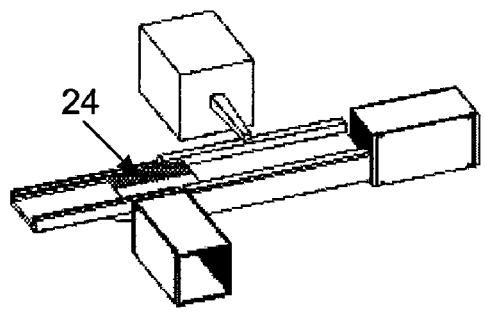
Figure 3:
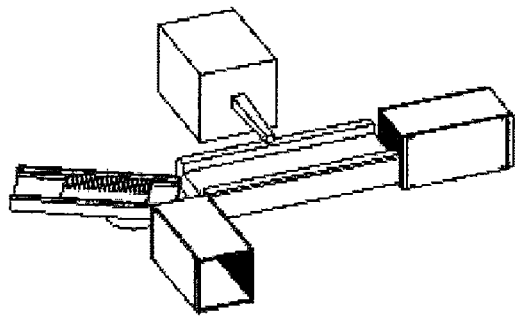
Figure 3:
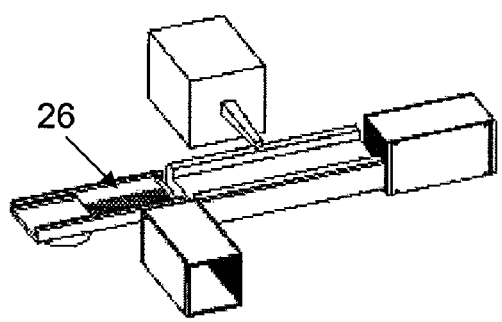
Figure 3:
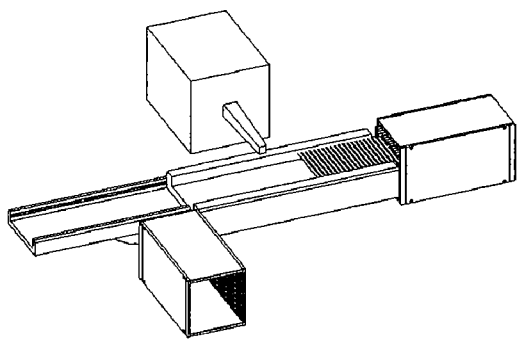
Figure 4:
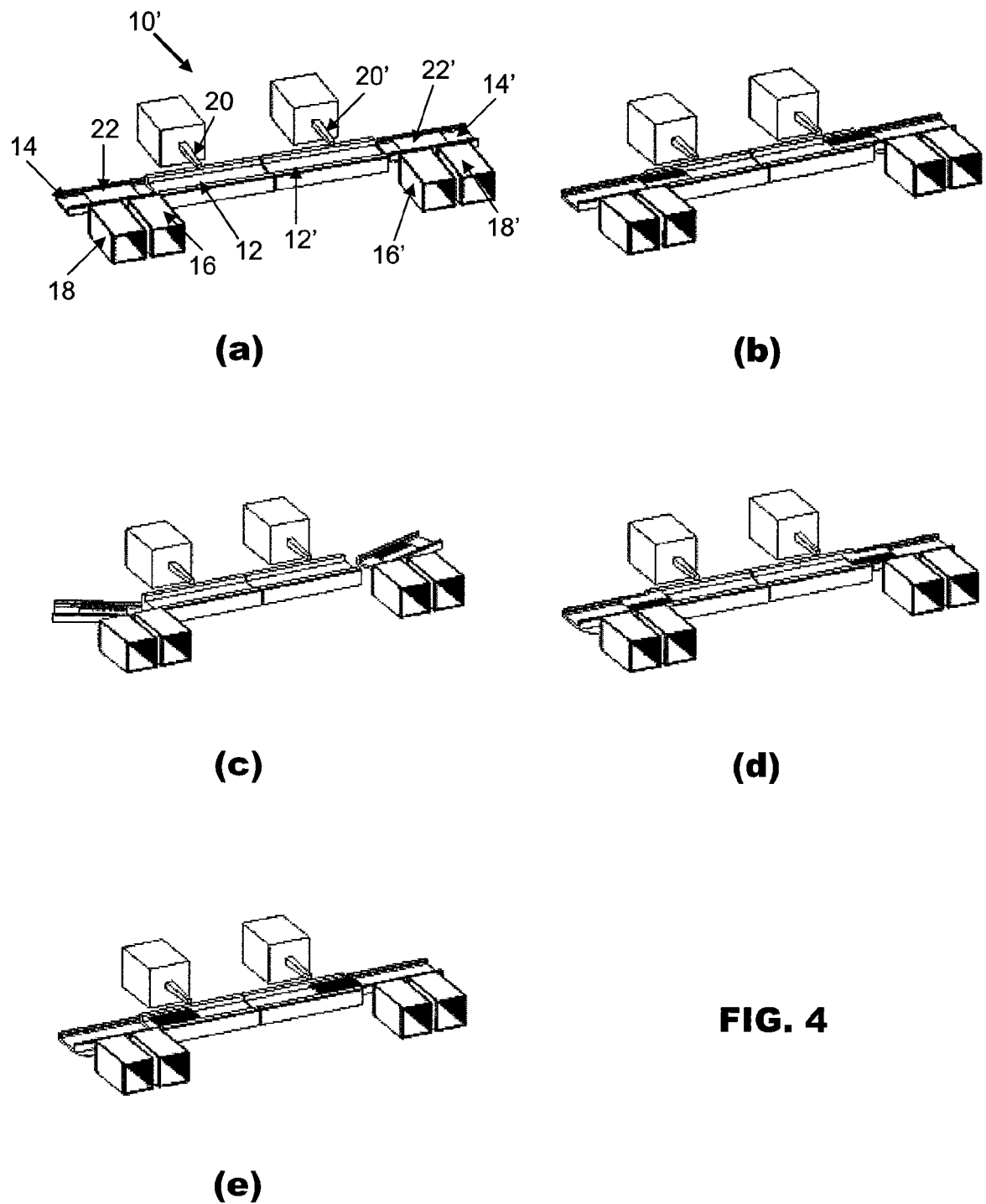
FIGS. 4(a) to 4(e) are schematic illustrations of a process for bonding electronic devices with large bonding areas simultaneously using a bonding apparatus with multiple bond heads.

Accordingly, in FIG. 3(a), an electronic device 22 is fed from the input magazine 16 onto the rotary buffer 14. The rotary buffer 14 then transfers the electronic device 22 onto the conveying track 12, for transporting the electronic device 22 for bonding at the bonding tool 20. After bonding of the first portion 24 of the electronic device 22 by the bonding tool 20, the electronic device 22 is sent back to the rotary buffer 14 as shown in FIG. 3(b).

In FIG. 3(c), the rotary buffer 14 rotates the electronic device 22 by 180° so that the second portion 26 of the electronic device 22 is positioned to be accessible by the bonding tool 20 for bonding (FIG. 3(d)). In FIG. 3(e), the whole of the electronic device 22 has been bonded and may be sent towards the output magazine 18 for storage.

FIGS. 4(a) to 4(e) are schematic illustrations of a process for bonding electronic devices 22 with large bonding areas simultaneously using a bonding apparatus 10' with multiple bond heads. The input and output magazines 16, 18 are arranged relative to the conveying track 12 as described in FIGS. 2(a) to 2(e) above, but the difference is that since there is another bond head on the bonding apparatus 10', there are a second set of conveying track 12', rotary buffer 14', input magazine 16' and output magazine 18' relative to a second bonding tool 20'. Their set-up mirrors that of the first set of components. The various components function essentially in the same way as in FIG. 2(a) to 2(e) above, and it is not necessary to repeat their functions. The main difference is that two electronic devices 22, 22' with large bonding areas can be bonded at the same time with the two bonding tools 20, 20' performing the described process simultaneously, thereby significantly improving the productivity of the bonding apparatus.

Figure 5:
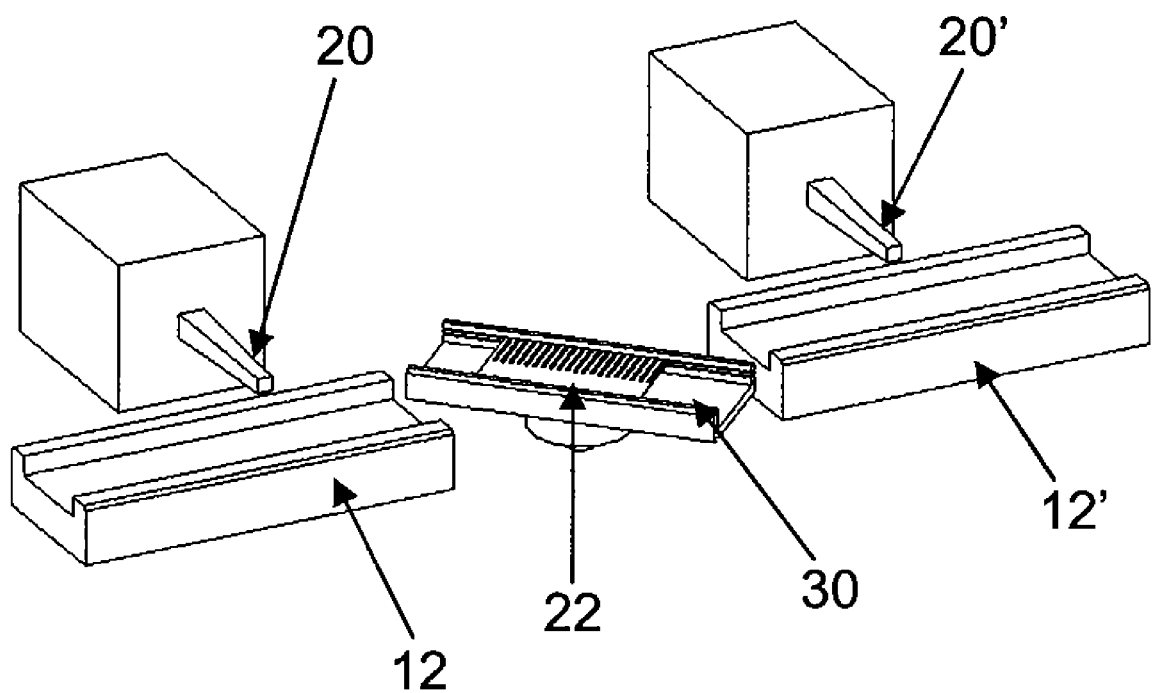
FIG. 5 is a schematic illustration of a rotary platform positioned between multiple bond heads according to another preferred embodiment of the invention.

In an alternative preferred embodiment illustrated in FIG. 5, another rotary buffer 30 could be located between the bonding tools 20, 20' in between the two adjoining sets of conveying tracks 12, 12' so that after bonding of a first portion of an electronic device 22 by the first bonding tool 20, the electronic device 22 can be conveyed to the rotary buffer to change its orientation, followed by conveyance to the second bonding tool 20' for bonding a second portion of the electronic device 22.

It should be appreciated that the electronic device handlers according to the preferred embodiments of the invention allow for separate input and output magazines to be mounted on the same side of the bonding apparatus while minimizing any increase in footprint of the machine. Furthermore, the rotary buffer for transferring leadframes can further function to change an orientation of an electronic device with a large bonding area to enable bonding of a whole of the electronic device without having to introduce a positioning table with a longer y-axis range that is sufficient to cater to a whole y-axis of the electronic device.

The invention described herein is susceptible to variations, modifications and/or additions other than those specifically described and it is to be understood that the invention includes all such variations, modifications and/or additions which fall within the spirit and scope of the above description.

What is claimed is:

1. A method of bonding a large electronic device having a bonding area on one side that comprises first and second portions, the method comprising the steps of:

locating the first portion but not the second portion of the electronic device for bonding by a bonding tool;

bonding the first portion of the electronic device;

conveying the electronic device to a rotary platform that is rotatable along a substantially horizontal plane;

rotating the electronic device on the rotary platform to change the respective positions of the bonded first portion and unbonded second portion of the electronic device;

conveying the electronic device to the bonding tool such that the second portion of the electronic device is located for bonding by the bonding tool; and thereafter bonding the second portion of the electronic device.

2. The method as claimed in claim 1, wherein the electronic device is rotated by 180° along the horizontal plane.

3. The method as claimed in claim 1, further comprising the step of transferring the electronic device to a conveying track for conveying the electronic device between the bonding tool and the rotary platform.

4. The method as claimed in claim 1, wherein the first and second portions of the electronic device each comprises half a surface area of the electronic device.

5. A method of bonding a large electronic device having a bonding area on one side that comprises first and second portions, the method comprising the steps of:
  locating the first portion but not the second portion of the electronic device for bonding by a first bonding tool;
  bonding the first portion of the electronic device;
  conveying the electronic device to a rotary platform that is rotatable along a substantially horizontal plane;
  rotating the electronic device on the rotary platform to change the respective positions of the bonded first portion and unbonded second portion of the electronic device;
  conveying the electronic device to a second bonding tool such that the second portion of the electronic device is located for bonding by the second bonding tool; and thereafter
  bonding the second portion of the electronic device.

* * * * *